United States Patent [19]

Busacca et al.

[11] 4,234,855

[45] Nov. 18, 1980

[54] SYSTEM FOR LINEARLY TUNING A MICROWAVE OSCILLATOR

[75] Inventors: Guido Busacca; Pietro Luparello; Lucio Marranca; Michele Sanfilippo, all of Palermo, Italy

[73] Assignee: Societa Italiana Telecomunicazioni Siemens S.p.A., Milan, Italy

[21] Appl. No.: 8,091

[22] Filed: Jan. 31, 1979

[30] Foreign Application Priority Data

Feb. 2, 1978 [IT] Italy .................................. 19895 A/78

[51] Int. Cl.³ .......................... H01P 7/04; H03B 9/10; H03B 23/00
[52] U.S. Cl. .................................. 331/90; 315/39.61; 331/178; 333/226
[58] Field of Search ...................... 331/64, 90, 96, 101, 331/177, 178; 333/224, 225, 226, 232, 233; 315/39.61

[56] References Cited

U.S. PATENT DOCUMENTS

| | | | |
|---|---|---|---|
| 3,414,761 | 12/1968 | Glenfield | 331/90 X |
| 3,441,794 | 4/1969 | Chun | 331/90 X |
| 3,441,795 | 4/1969 | Hynes et al. | 331/90 X |
| 3,590,313 | 6/1971 | Stoke | 315/39.61 |
| 3,852,638 | 12/1974 | Stoke | 315/39.61 |

*Primary Examiner*—Siegfried H. Grimm
*Attorney, Agent, or Firm*—Karl F. Ross

[57] ABSTRACT

A resonant cavity of a microwave generator, such as a magnetron oscillator, is provided with a tuning piston which is displaceable between two terminal positions, corresponding to respective limiting frequencies $f_1$ and $f_2$, by means of a rotating crankshaft to which the piston is coupled by a linkage including a pitman with a substantially linearly guided extremity remote from the crankshaft axis. The length p of the pitman, measured between the pivotal axes of its extremities, is related to the eccentricity e of the crankshaft by the expression $$p = \frac{q-e}{2} + \frac{e^2}{2(q-e)}$$

where q is the length of the stroke of the linearly guided extremity between its extended dead-center position and an intermediate position in which the operating frequency of the generator has its mean value $(f_1+f_2)/2$. With this dimensioning, the frequency varies as a sinusoidal function of the crankshaft angle and is therefore proportional to the output voltage of an angle sensor coupled with the crankshaft.

6 Claims, 7 Drawing Figures

SYSTEM FOR LINEARLY TUNING A MICROWAVE OSCILLATOR

FIELD OF THE INVENTION

Our present invention relates to a system for linearly tuning a generator of microwaves, such as a magnetron oscillator, to vary its operating frequency in a controlled manner.

BACKGROUND OF THE INVENTION

The tuning of a microwave generator, e.g. an oscillator formed by a coaxial magnetron, is generally accomplished with the aid of a linearly displaceable element such as a piston, designed to modify the effective volume of a resonant cavity, having two terminal positions in which the operating frequency respectively lies at the lower and upper limits of its range. The change in frequency, however, is not proportional to the displacement of the tuning element. Thus, the instantaneous operating frequency cannot be directly ascertained from the magnitude of an output signal emitted by a conventional position sensor such as a resolver determining the angle of rotation of a crankshaft from a certain reference position. Since a crankshaft linked with the tuning element via a connecting rod or pitman is a convenient means for the adjustment of the generator frequency, it is desirable to obtain a precise correlation between that frequency and the crankshaft position.

Such correlation is important, for example, in a radar or other installation where a microwave receiver must be tuned, under the control of an output signal from a position sensor, to a frequency corresponding to that of an associated microwave transmitter whose operating frequency is varied in the aforedescribed manner.

Conventional systems for establishing a linear relationship between the frequency of a microwave oscillator, controlled by a linearly displaceable tuning element, and the output signal of a resolver, monitoring the angular position of a crank or cam operatively coupled with that element, make use of one or more pairs of eccentric gears in mesh with each other. Such devices are cumbersome and, upon prolonged use, tend to become inaccurate owing to wear of their gear teeth.

OBJECT OF THE INVENTION

The object of our present invention, therefore, is to provide simple mechanical means for linearizing the relationship between the operating frequency of a magnetron-type or other microwave oscillator and the output signal of a position sensor associated with the drive of a tuning element.

SUMMARY OF THE INVENTION

We have found, in accordance with our present invention, that such linearity is achieved if the tuning element of the microwave oscillator is driven by a crankshaft of eccentricity e via a linkage including a connecting rod or pitman of effective length p, measured between the pivotal axes of its extremities, and if the foot of the pitman (i.e. its extremity remote from the axis of rotation of the crankshaft) is substantially linearly guided between two dead-center positions respectively corresponding to the limiting frequencies $f_1$ and $f_2$ of the controlled oscillator, provided that the parameters e and p satisfy the expression $$p = \frac{a-e}{2} + \frac{e^a}{2(q-e)}$$

where q is the length of the stroke of the pitman foot between its extended dead-center position (the one farther from the crankshaft axis) and an intermediate position in which the oscillator frequency has a mean value of $(f_1+f_2)/2$. As will be shown hereinafter, the frequency then varies as a sinusoidal function of the angle of rotation of the crankshaft and is therefore proportional to the output signal of a resolver or equivalent position sensor coupled with that crankshaft.

Especially in the case of a microwave generator tunable with the aid of an annular piston, as more fully described hereinafter, the linkage between the crankshaft and the tuning element should further include a direction changer designed to convert an outward movement of the pitman (as seen from the crankshaft axis) into a retraction of that element from an opposite wall of the resonant cavity whereby the latter is enlarged to lower the operating frequency. If the direction changer comprises a lever articulated to the foot of the pitman and to an extension of the tuning element, any inequality in the length of the lever arms will make the displacement of the tuning element different from that of the pitman foot but will not affect the linear relationship between the operating frequency and the sensor output.

BRIEF DESCRIPTION OF THE DRAWING

The above and other features of our present invention will now be described in detail with reference to the accompanying drawing in which.

SPECIFIC DESCRIPTION

Figure 1:
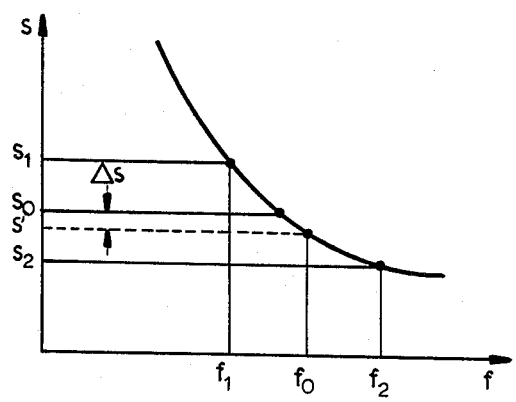
FIG. 1 is a graph showing the functional relationship between the frequency of a microwave oscillator and the stroke of a tuning element thereof.
Figure 4:
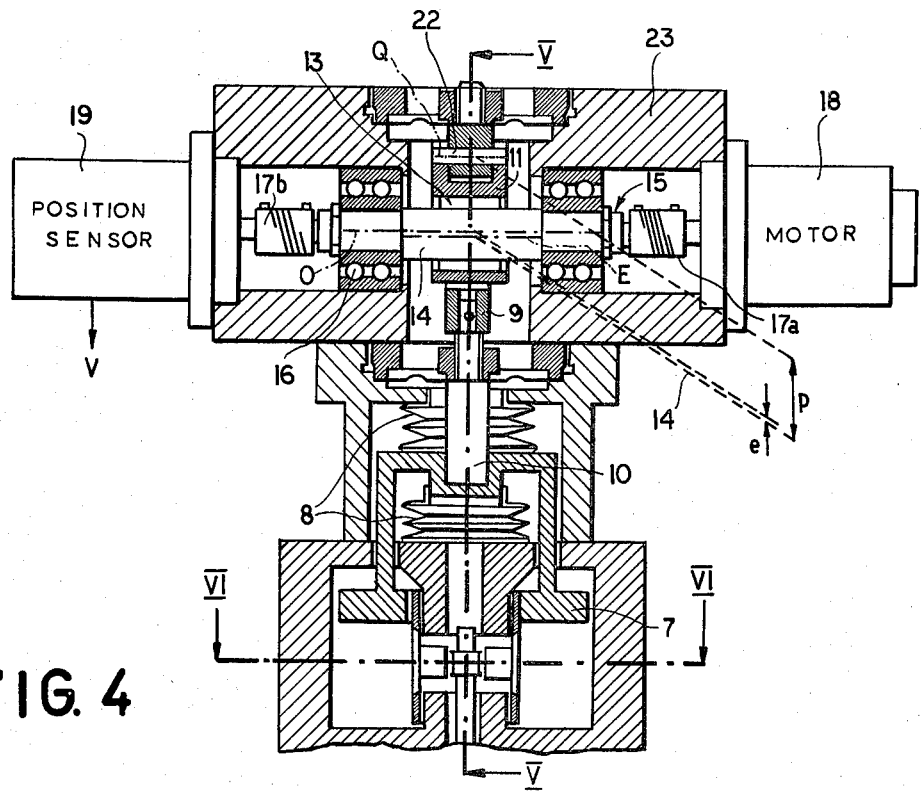
FIG. 4 is an axial sectional view of a magnetron oscillator including a tuning piston linked with a motor-driven crankshaft.
Figure 5:
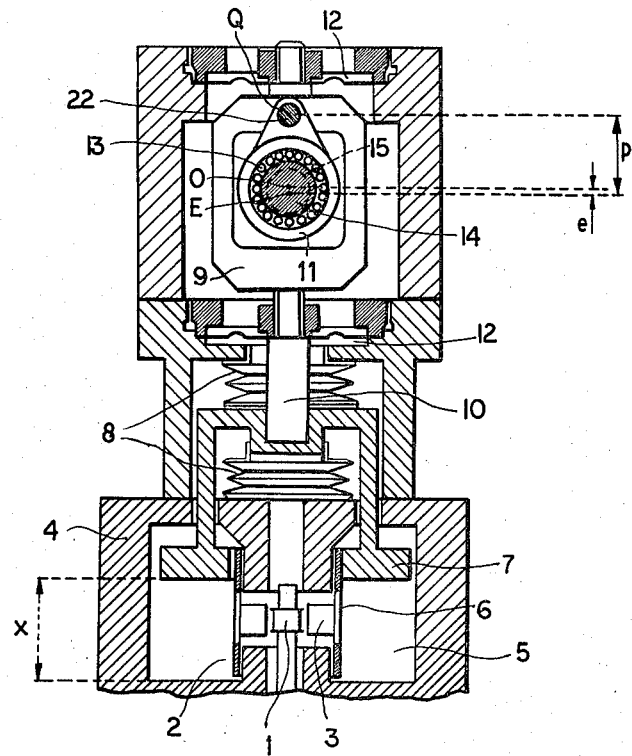
FIGS. 5 and 6 are sectional views respectively taken on the lines V—V and VI—VI of FIG. 4.

In FIG. 1 we have shown the stroke s of a linearly displaceable tuning element, such as an annular piston 7 shown in FIGS. 4 and 5, plotted against the operating frequency of a microwave generator of the coaxial-magnetron type with a resonant cavity whose effective volume is adjustable by means of that tuning element. Two terminal piston positions $s_1$ (retracted) and $s_2$ (extended) correspond to respective limiting frequencies $f_1$ (minimum) and $f_2$ (maximum). A mean frequency $f_0=(f_1+f_2)/2$, however, corresponds to a piston position s' which is separated by a distance $\Delta s$ from a midposition $s_0$ halfway between terminal positions $s_1$ and $s_2$.

Figure 2:
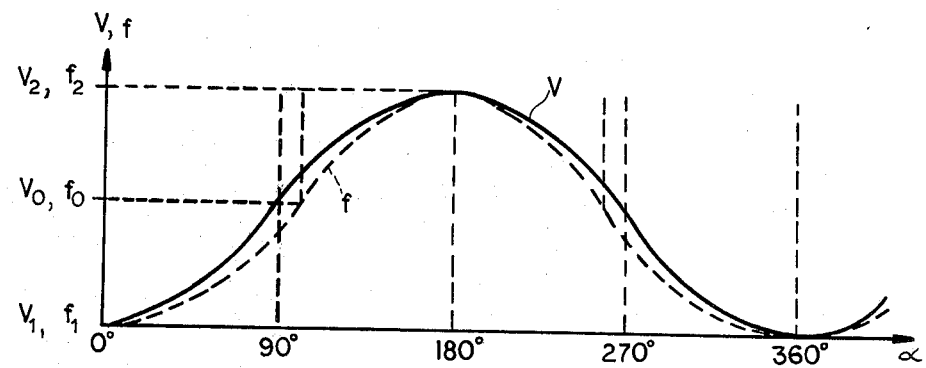
FIG. 2 is a graph showing the oscillator frequency and the output signal of a position sensor as a function of the angle of rotation of a crankshaft linked with the tuning element.

In FIG. 2 we have shown an output voltage V, generated by a position sensor, and the oscillator frequency f as functions of the angle of rotation α of a crankshaft driving the tuning position. The signal V is a sine curve (solid line) whereas the frequency f follows a pseudo-sinusoidal curve (dotted line) which, aside from a proportionality factor, coincides with curve V at 0°/360° and 180° but deviates from it at 90° and 270° as well as in intervening angular positions. The deviation between the two curves depends on the length of the pitman; in the instance of FIG. 2 we have assumed that this pitman is of infinite length so that a full revolution of its head pivoted to the crankshaft results in a simple harmonic motion of its foot.

Figure 3:
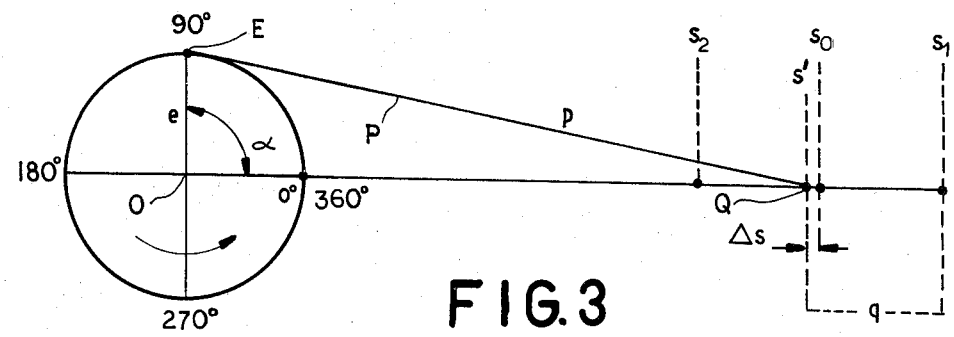
FIG. 3 diagrammatically illustrates a crankshaft-driven pitman forming part of a linkage for the adjustment of the tuning element.

In FIG. 3 we have schematically shown the eccentric portion of a crankshaft rotating about an axis O, the midpoint E of that portion representing the pivotal axis of the head of a pitman P whose foot has a pivotal axis Q and is linearly guided in a plane including the axis O to reciprocate between dead-center positions $s_1$ and $s_2$. Pitman P has an effective length p; the eccentricity of the crankshaft has been designated e. The angle of rotation α is measured from the aforementioned plane including axes O and Q.

The stroke s of the pitman foot, measured from its extended dead-center position $s_1$, is given by $$s = e(1 - \cos\alpha) + p(1 - \sqrt{1 - h^2\sin^2\alpha}) \quad (1)$$

where $h = e/p$. For a stroke length q corresponding to the illustrated quadrature position with $\alpha = 90°$, this equation reduces to $$q = e + p - \sqrt{p^2 - e^2}. \quad (2)$$

It will be noted that, in arriving at this quadrature position from the reference position in which $\alpha = 0$, the foot of pitman P has moved past the midposition $s_0$ by the distance $\Delta s$.

Equation (2) can be solved for p to give $$p = \frac{q - e}{2} + \frac{e^2}{2(q - e)} \quad (3)$$

Thus, if the stroke q brings the point Q into the position s' in which frequency f is at its mean value $f_0$ as shown in FIG. 1, the deviation between curves V and f will disappear in the 90° and 270° positions of FIG. 2 so that the two curves will coincide. This means that, with a dimensioning of pitman length p and crankshaft eccentricity e according to equation (3) where q has the proper magnitude as determined by the frequency characteristic of the controlled oscillator, the operating frequency f will follow a sinusoidal curve and will be proportional to output signal V in any angular position of the crankshaft.

Let us assume, by way of example, that the oscillator comprises a magnetron adjustable between limiting frequencies $f_1$ and $f_2$ by a linear displacement of its tuning piston with a maximum stroke of 4 mm. If that piston is connected to the foot of pitman P without interposition of a lever or other coupling introducing a transmission ratio different from unity, the eccentricity e of the crankshaft will have to be 2 mm. Let us further assume that the mean frequency $f_0$ has been experimentally found to occur when the piston has been advanced from its retracted terminal position, in which the resonant cavity has its smallest volume, by a stroke q = 2.24 mm. Insertion of these values in equation (3) then yields a value of 8.45 mm for the length p of the pitman P as measured between the pivotal axes E and Q of its articulated extremities.

Figure 6:
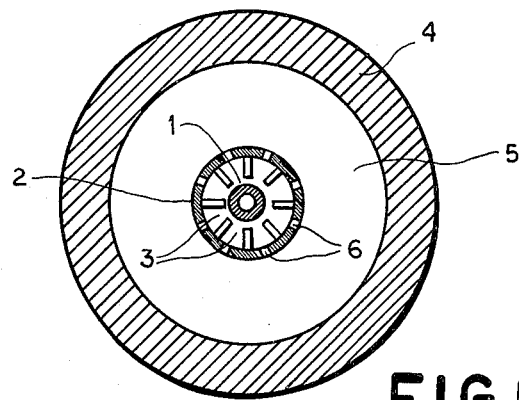

FIGS. 4–6 show a magnetron-type microwave oscillator comprising a cathode 1 at the center of an anode block 2 formed with a multiplicity of sectoral cavities 3. This electrode structure is concentrically surrounded by an annular cylinder 4 defining therewith an annular resonant cavity 5 which communicates with the cavities 3 by way of slots 6 in the anode wall. The effective volume of resonant cavity 5 can be varied with the aid of a ring-shaped piston 7 of conductive material, spaced from the conductive cavity walls, suspended from a vertically movable stem 10 which is slidably guided in a pair of spiders 12. The cavity 5 is evacuated and is sealed against the atmosphere by a pair of airtight bellows 8.

Stem 10 is interrupted by a yoke 9, rigid therewith, which surrounds an eccentric portion 14 of a crankshaft 15 engaged by the head of a pitman 11 through the intermediary of a roller bearing 13. The foot of the pitman is fulcrumed to the yoke 9 by means of a pivot pin 22. The effective length p of the pitman is measured between the axes E and Q of eccentric shaft portion 14 and pin 22. Cavity 5 has a height x which can be varied by a piston stroke equal to twice the eccentricity e of the crankshaft, the latter being supported by ball bearings 16 in a housing 23.

Shaft 15 is driven by a motor 18 through a preferably flexible coupling 17a and is connected via a similar coupling 17b with a position sensor 19 whose output voltage V is a sinusoidal function of the angle of rotation as discussed above with reference to FIG. 2. In the illustrated position of shaft 15, in which its eccentric position or crank 14 is at its lowest point corresponding to the 180° position of FIG. 3, resonant cavity 5 has its smallest volume so as to generate the maximum frequency $f_2$. The raising of piston 7 during the next half-cycle reduces that operating frequency to its mean value $f_0$ upon a shaft rotation of 90° and to its minimum value $f_1$ after a further 90° rotation.

Figure 7:
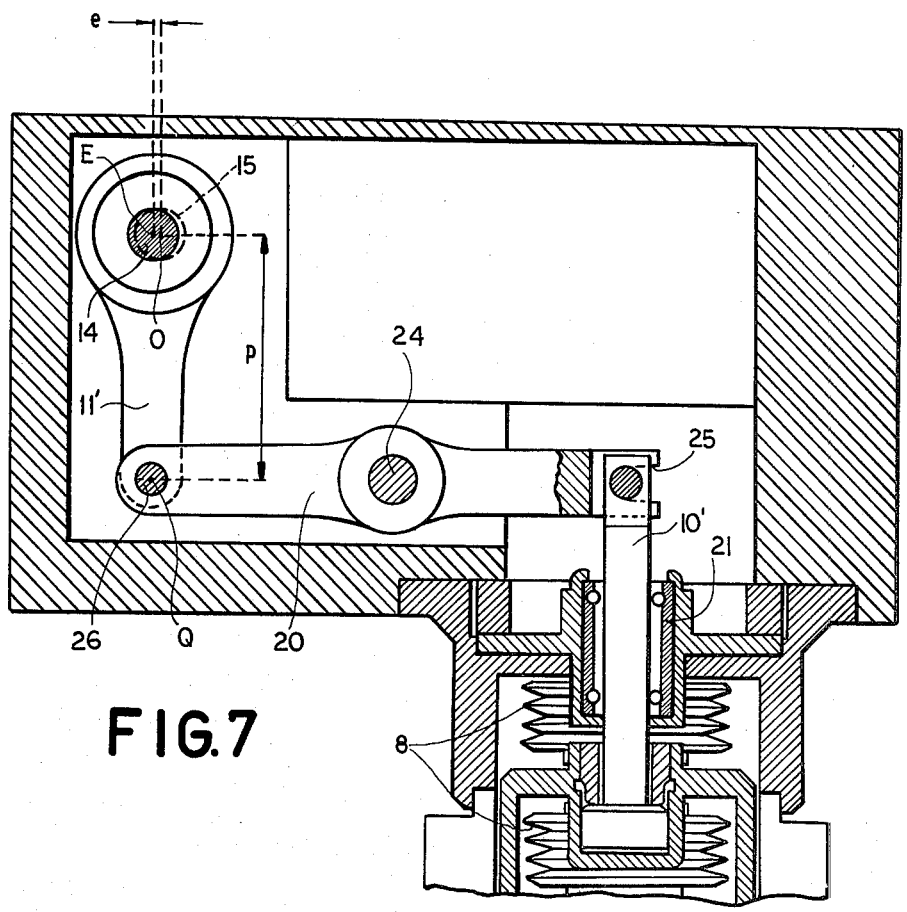
FIG. 7 is an axial sectional view, similar to FIG. 4 but drawn to a larger scale, of part of the magnetron oscillator provided with a modified piston drive.

In FIG. 7 we have shown part of a magnetron oscillator similar to that of FIGS. 4–6 whose tuning piston has a stem 10' linked with a pitman 11' on a crank 14 by way of a two-arm lever 20 having a central fulcrum 24. Stem 10' is vertically guided by a ball-bearing sleeve 21 and is articulated to the right-hand arm of lever 20 via a pin-and-slot coupling 25 facilitating the swinging of that lever without affecting the linearity of the piston motion. The foot of pitman 11', on the other hand, is pivoted to the left-hand lever arm by a pin 26 so as to deviate slightly from a strictly linear course during rotation of the crankshaft. If the pitman 11' and the associated lever arm have lengths substantially exceeding the stroke 2e, this minor nonlinearity can be tolerated; for greater precision we may let the pin 26 engage a slot of the lever (similarly to coupling 25) and to journal that pin in a vertically guided member such as stem 10' to insure exact linearity. As noted above, the ratio of the lever arms (here 1:1) must be taken into account when determining the pitman length p as a function of the piston stroke in accordance with equation (3).

It will be noted that the yoke 9 of FIGS. 4–6 and the lever 20 of FIG. 7 operate as direction changers by converting the sense of motion of the pitman 11 or 11' into an opposite sense of motion of the piston 7. This is necessary because, as is apparent from FIGS. 1 and 3, the extended position $s_1$ of the linearly guided pitman extremity corresponds to the lowest operating frequency $f_1$ which calls for a retraction of the piston to establish the largest volume of the resonant cavity 5. The straight lever 20 could, however, be replaced by one of the bell-crank type, in which case the motion of the pitman foot would not be parallel to that of the piston.

We claim:

1. In a generator of microwaves of variable frequency provided with a resonant cavity and a tuning element in said cavity, said tuning element being linearly displaceable between two terminal positions corresponding to respective limiting frequencies $f_1$ and $f_2$, the combination therewith of:

a rotatable crankshaft;

a mechanical linkage coupling said crankshaft with said tuning element, said linkage including a pitman with a first extremity fulcrumed on said crankshaft and a second extremity positively connected with said tuning element via a pivotal joint, said crankshaft having an eccentricity e, said pitman having an effective length p measured between the pivotal axes of said extremities, said second extremity being substantially linearly guided between a first dead-center position farther from the axis of said crankshaft and a second dead-center position closer to said axis respectively coinciding with said terminal positions of said tuning element;

drive means coupled with said crankshaft for rotating same about said axis; and position-sensing means coupled with said crankshaft for emitting an output signal varying as a sinusoidal function of the angle of rotation of the crankshaft from a predetermined reference position;

the length p being related to the eccentricity e by the expression $$p = \frac{q-e}{2} + \frac{e^2}{2(q-e)}$$

where q is the distance of travel of said second extremity between said first dead-center position and an intermediate position thereof in which said frequency has a mean value of $(f_1+f_2)/2$ whereby said frequency varies as a sinusoidal function of said angle of rotation and is proportional to said output signal.

2. The combination defined in claim 1 wherein said resonant cavity forms part of a magnetron oscillator.

3. The combination defined in claim 2 wherein said tuning element is an annular piston surrounding an anode structure.

4. The combination defined in claim 1, 2 or 3 wherein said second dead-center position is translated by said linkage into a terminal position of said tuning element corresponding to a minimum frequency.

5. The combination defined in claim 4 wherein said linkage includes direction-changing means for converting an outward displacement of said second extremity into a retraction of said tuning element.

6. The combination defined in claim 5 wherein said direction-changing means comprises a lever with two arms respectively articulated to said second extremity and to an extension of said tuning element.

* * * * *